US007154419B2

(12) United States Patent
Mukai

(10) Patent No.: US 7,154,419 B2
(45) Date of Patent: Dec. 26, 2006

(54) AUDIO APPARATUS FOR PROCESSING VOICE AND AUDIO SIGNALS

(75) Inventor: Takuo Mukai, Ikeda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/220,995

(22) Filed: Sep. 7, 2005

(65) Prior Publication Data

US 2006/0049968 A1 Mar. 9, 2006

(30) Foreign Application Priority Data

Sep. 7, 2004 (JP) ............................ 2004-259735

(51) Int. Cl.
*H03M 7/00* (2006.01)

(52) U.S. Cl. .......................... 341/61; 341/50; 375/372

(58) Field of Classification Search ................. 341/61; 375/372, 298; 348/731

See application file for complete search history.

(56) References Cited

U.S. PATENT DOCUMENTS 6,016,170 A * 1/2000 Takayama et al. .......... 348/731
6,504,879 B1 * 1/2003 Iwamatsu .................. 375/298
6,952,461 B1 * 10/2005 Yasuda et al. ............. 375/372

FOREIGN PATENT DOCUMENTS

JP 2000-299718 10/2000

* cited by examiner

*Primary Examiner*—Jean Bruner Jeanglaude
(74) *Attorney, Agent, or Firm*—Cooper & Dunham LLP

(57) ABSTRACT

An audio apparatus for performing digital data processing on voice and audio signals through interrelated data sampling and processing. A predetermined mixing processing in the audio apparatus is performed by a first digital processing circuit on both (a) digital received-voice signals converted into the signals sampling processed at a frequency n×fs by a first sampling frequency conversion circuit, and (b) digital audio signals converted into the signals sampling processed at the frequency n×fs by a third sampling frequency conversion circuit. Another predetermined mixing processing is performed by a second digital processing circuit on both (i) digital audio signals converted into the signals sampling processed at a frequency N×Fs by a second sampling frequency conversion circuit, and (ii) digital voice signals converted into the signals sampling processed at the frequency N×Fs by the third sampling frequency conversion circuit.

13 Claims, 6 Drawing Sheets

AUDIO APPARATUS FOR PROCESSING VOICE AND AUDIO SIGNALS

FIELD

This patent specification relates generally to audio apparatuses for processing voice and audio signals, and more particularly to an apparatus for performing digital data processing on voice and audio signals through interrelated data sampling and processing.

DISCUSSION OF THE BACKGROUND

As the use of mobile or cellular phones becomes more widespread, the integration of phone capability is increasing rapidly, benefiting from the increase in the degree of semiconductor integration, typically exemplified by LSI (large-scale integration) devices.

The integration of several capabilities is apparent, for example, in a mobile phone capable of handling both telephone communications and music reproduction through a single phone apparatus, or even telephone, music playback, video recording, and audio recording capabilities.

The LSI device included as discrete components in the current mobile phone often can perform signal mixing of (a) voice signals, which are input on demand through a voice-sound input means, with reproduced music signals, or (b) other party's voice signals, which are demodulated after reception, with music signals. Following the mixing, resultant signals are sent either to a transmitting processing block or respective outputting means provided in the phone such as a speaker or a headphone.

FIG. 6 is a diagrammatic block diagram illustrating a known audio apparatus included in a mobile phone, which is adapted to perform voice signal processing (for example, Japanese Laid-Open Patent Application No. 2000-299718).

In the audio (inclusive of voice) apparatus of FIG. 6, digital voice signals SDVa, which are demodulated after reception, are converted by a voice D/A converter 101 into analog signals, subjected to volume control processing by an analog processing circuit 104, and output through a voice outputting means such as a first speaker SPa and others.

On the other hand, analog voice signals, which are input through a voice input means such as a microphone (MIC) and others, are subjected to volume control processing, additive (i.e., addition and subtraction) operation and other similar operation by an analog processing circuit 105, converted by a voice A/D converter 102 into digital signals SDVb, and sent to a transmitting modulation processing block.

The scheme of FIG. 6 is merely one of various examples for mixing voice and audio signals, and other alternative means maybe devised for the mixing process. The previous methods primarily utilize analog signal processing, which performs volume control processing and additive operation using operation amplifiers, in particular.

As a result, several difficulties can arise, such as degradation in analog signal characteristics caused by process fluctuation during operational-amplifier production, and occurrence of audible noises resulted from infusion of high frequency (noise) signals in the phone apparatus.

In order to obviate such difficulties, a method has been proposed, which is adapted to provide a D/A converter right before the outputting means such as a speaker and an A/D converter right after the voice inputting means such as a microphone, perform digital signal processing on both the digital signals prior to the conversion into analog signals for an output stage and on the digital signals following the conversion into digital signals by an input stage, and perform several operation and control such as additive operation and volume control processing.

As a result, since input signals such as digital voice signals and digital audio signals can be subjected to digital processing such as signal mixing and others directly in the digital domain without converting into analog signals, the degradation in signal characteristics can be prevented, which may otherwise occur when the digital signals are converted into analog signals.

FIG. 7 is a diagrammatic block diagram illustrating another known audio apparatus devised to attain such capability as mentioned just above.

Referring to FIG. 7, digital voice signals SDVa, which are generated by receiving and modulating digital voice signals previously received through sampling at a sampling frequency fs, are subjected by a first over sampling circuit Sc to an oversampling process at a frequency of a multiple of fs (for example, 4×fs).

Subsequently, resultant signals are sent to both a first digital processing circuit Da and a second sampling frequency conversion circuit Sb.

Following the over sampling process, the sampled digital voice signals SDVa are subjected in a first digital processing circuit Da to several processes such as volume control processing and desired signal bandwidth control processing, converted by a voice D/A converter Ca into analog signals SAVa, and output through a first speaker SPa as a voice outputting means.

In addition, the sampling frequency of the digital voice signals is converted by the second sampling frequency conversion circuit Sb, into the sampling frequency of the digital audio signals.

On the other hand, digital audio signals SDMa, which are regenerated through sampling at another sampling frequency Fs, are subjected by a second over sampling circuit Sd to an over sampling process at a frequency of a multiple of Fs (for example, 4×Fs). Subsequently, resultant signals are sent to both a third digital processing circuit Dc and a first sampling frequency conversion circuit Sa.

Following the oversampling process, the sampled digital voice signals SDMa are subjected in a third digital processing circuit Dc to several processes such as performing additive operation with digital voice signals, the frequency of which is converted by the second sampling frequency conversion circuit Sb, as mentioned just above, setting the ratio for the additive operation, adjusting sound volume, and controlling audio tone following the desired signal bandwidth control processing under predetermined program setting.

Thereafter, resultant signals are converted by an audio D/A converter Cc into analog audio signals SAMa, and output through a second speaker SPb and a headphone HP.

In addition, the sampling frequency of the digital audio signals is converted by the first sampling frequency conversion circuit Sa, into the sampling frequency of the digital voice signals.

Moreover, analog voice signals SAVb, which are input through a voice input means such as a microphone (MIC) and others, are converted by a voice A/D converter Cc into digital voice signals SDVb.

Following the conversion process, the converted digital voice signals SDVb are subjected in the second digital processing circuit Db to several processes such as performing additive operation with digital audio signals, setting the ratio for the additive operation, and adjusting sound volume.

Subsequently, the sampling of the resultant signals are performed by a downsampling circuit Se at a sampling frequency of one fourth of 4×fs, (i.e., fs) and sent to a circuit block (not shown) for performing transmission modulation.

In the frequency conversion with the above noted apparatuses, however, the degradation in audio characteristics has been encountered for the signals depending on their sampling frequency among plural kinds of signals, which are sampled for respectively at sampling frequencies different from each other.

More specifically, the degradation becomes more apparent in the case when the signals having a relatively large bandwidth are sampling-processed at frequencies of smaller bandwidth, since the Nyquist frequency having relatively narrow bandwidth limits the bandwidth of the original signals during digital filtering process. Because of the narrowed bandwidth, the audio characteristics of the signals attained by the following digital signal operation may be degraded compared with those obtained by analog signal processing.

It is therefore desirable to obviate the difficulty of the abovementioned degradation in audio characteristics caused by sampling processing at different sampling frequencies.

SUMMARY

Accordingly, it is an object of the present disclosure to provide an audio apparatus for performing digital data processing on voice and audio signals, having most, if not all, of the advantages and features of similar employed apparatuses, while eliminating many of the aforementioned disadvantages.

It is another object to provide improved techniques capable of obviating degradation in audio characteristics caused by a sampling process performed on the signals sampled at different sampling frequencies, which is carried out by converting signals through sampling processing at a frequency as high as possible, thereby obviating the degradation through the following digital signal operation, preventing further degradation by performing digital signal processing thoroughly after eliminating analog signals by utilizing class D amplifiers for driving external load such as a speaker and similar other device, and still obviating the increase in circuit size resulted from the adoption of the class D amplifiers by sharing some of sampling frequency conversion process.

The following description is a synopsis of only selected features and attributes of the present disclosure. A more complete description thereof is found below in the section entitled "Description of the Preferred Embodiments".

According to an embodiment of this disclosure (FIG. 8), a method for performing signal processing on voice and audio signals includes (a) converting digital voice signals previously sampling processed at a first predetermined sampling frequency fs into converted voice signals sampling processed at a frequency, n×fs, as a multiple of the first predetermined sampling frequency fs with n being a first integral number larger than unity (step S81), (b) converting the converted voice signals sampling processed at the frequency, n×fs, into signals sampling processed at the frequency, N×Fs, (step S82), (c) converting digital audio signals previously sampling processed at a second predetermined sampling frequency Fs into second converted signals sampling processed at a frequency, N×Fs, as a multiple of the second predetermined sampling frequency Fs with N being a second integral number larger than unity (step S83), (d) converting the converted audio signals into signals sampling processed at the frequency, n×fs, (step S84), (e) performing a first predetermined digital processing operation on the converted voice signals sampling processed at the frequency, n×fs, and on the converted audio signals sampling processed at the frequency, n×fs, (step S85), and (f) performing a second predetermined digital processing operation on the converted audio signals sampling processed at the frequency, N×Fs, and on the converted voice signals sampling processed at the frequency, N×Fs, (step S86).

An audio apparatus for performing a predetermined signal processing on voice and audio signals, according to an exemplary embodiment of this disclosure, comprises a sampling frequency conversion circuit and a digital processing circuit. The sampling frequency conversion circuit (a) converts digital voice signals previously sampling processed at a first predetermined sampling frequency fs into first converted signals sampling processed at a frequency, n×fs, as a multiple of the first predetermined sampling frequency fs with n being a first integral number larger than unity, (b) converts digital audio signals previously sampling processed at a second predetermined sampling frequency Fs into second converted signals sampling processed at a frequency, N×Fs, as a multiple of the second predetermined sampling frequency Fs with N being a second integral number larger than unity, (c) converts the first converted signals into third converted signals sampling processed at the frequency, N×Fs, and (d) converts the second converted signals into signals sampling processed at the frequency, n×fs. The digital processing circuit (i) performs a first predetermined digital processing operation on the digital voice signals converted into the first converted signals sampling processed at the frequency, n×fs, and on the digital audio signals converted into the fourth converted signals sampling processed at the frequency, n×fs, and (ii) performs a second predetermined digital processing operation on the digital audio signals converted into the second converted signals sampling processed at the frequency, N×Fs, and on the digital voice signals converted into the third converted signals sampling processed at the frequency, N×Fs.

An audio apparatus for performing a predetermined signal processing on voice and audio signals, according to another exemplary embodiment of this disclosure, can include as least a first sampling frequency conversion circuit, a second sampling frequency conversion circuit, a third sampling frequency conversion circuit, a first digital processing circuit and a second digital processing circuit. The first sampling frequency conversion circuit converts digital voice signals sampling processed at a sampling frequency fs into signals sampling processed at a frequency, n×fs, and outputs resultant signals. The second sampling frequency conversion circuit converts digital voice signals sampling processed at another sampling frequency Fs into signals sampling processed at a frequency, N×Fs, and outputs resultant signals. The third sampling frequency conversion circuit converts the signals output from the first sampling frequency conversion circuit into signals sampling processed at the frequency, N×Fs, and converts the signals output from the second sampling frequency conversion circuit into signals sampling processed at the frequency, n×fs, and outputs resultant signals. The first digital processing circuit performs a predetermined digital processing operation on the digital voice signals converted into the signals sampling processed at the frequency, n×fs, and on the digital audio signals converted into the signals sampling processed at the frequency, n×fs. The second digital processing circuit performs another predetermined digital processing operation on the digital audio signals converted into the signals sampling processed at the frequency, N×Fs, and on the digital voice signals converted into the signals sampling processed at the frequency, N×Fs.

The first and second digital processing circuits included in the audio apparatus are each adapted to perform predetermined mixing processes.

In addition, the audio apparatus further includes first and second D/A conversion circuits each incorporating ΔΣ modulators for performing predetermined D/A conversion on signals output from the first and second digital processing circuits, respectively, and for outputting resultant signals.

Still in addition, the audio apparatus further includes first and second class D amplifier units each consisting of class D amplifiers incorporating ΔΣ modulators, which are adapted to amplify signals output from the first and second digital processing circuits, respectively, and to output resultant signals.

BRIEF DESCRIPTION OF THE DRAWINGS

The present disclosure and features and advantages thereof will be more readily apparent from the following detailed description with reference to the following drawings.

DESCRIPTION OF THE PREFERRED EMBODIMENTS

Figure 1:
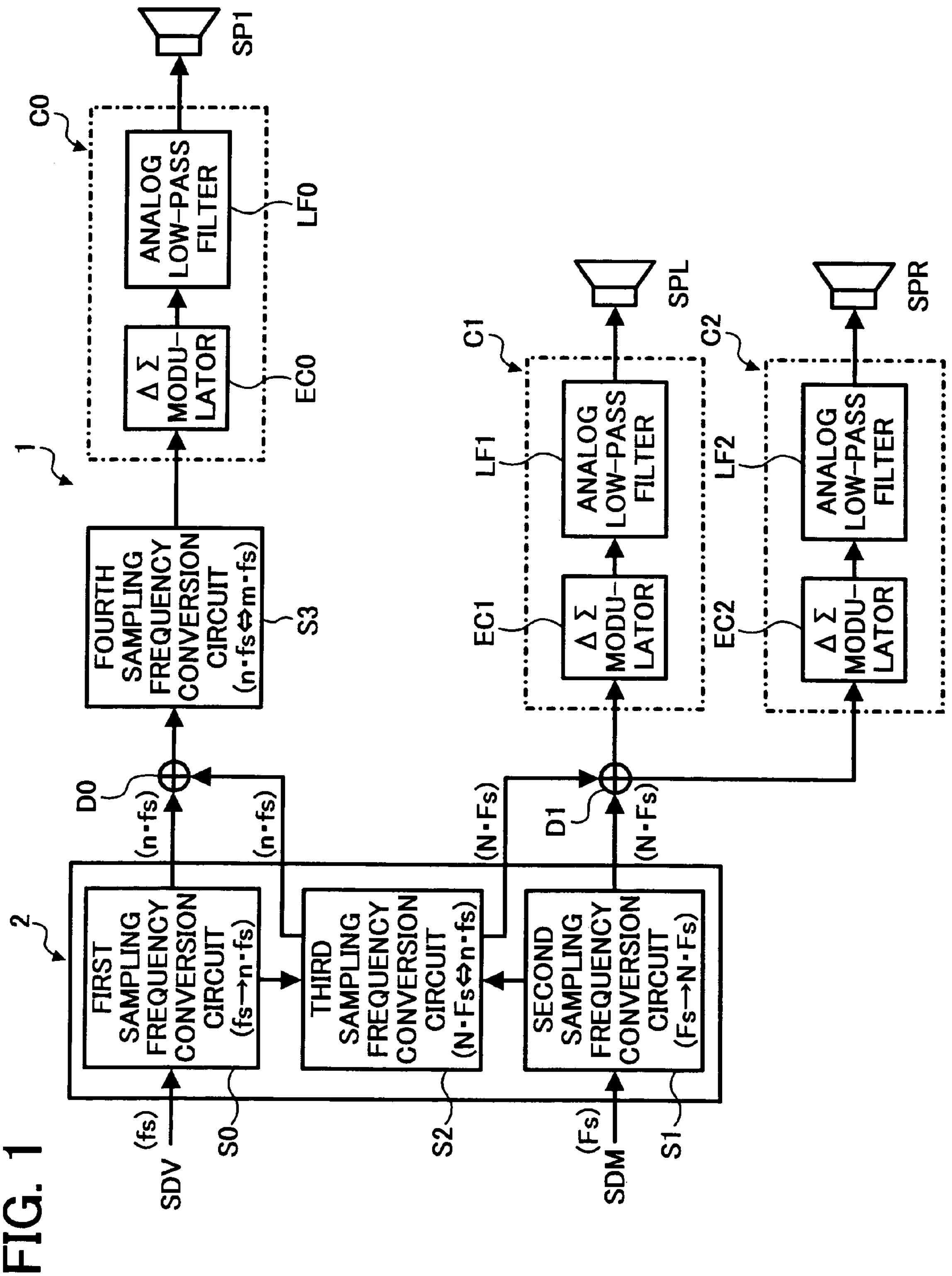
FIG. 1 shows a diagrammatic block diagram illustrating an audio apparatus according to a first embodiment disclosed herein.

In the detailed description which follows, specific, preferred embodiments of audio apparatuses are described particularly useful for performing a predetermined signal processing on voice and audio signals. It is understood, however, that the present disclosure is not limited to these embodiments. For example, the basic construction included in the audio apparatuses disclosed herein may also be adaptable to any form of voice and audio signal processing system. Other embodiments will be apparent to those skilled in the art upon reading the following description.

In addition, in the description that follows specific terminology is used in many instances for the sake of clarity. However, the disclosure of this patent specification is not intended to be limited to the specific terminology so selected and it is to be understood that each specific element includes all technical equivalents that operate in a similar manner.

According to a general example in the present disclosure, an audio apparatus for performing a predetermined signal processing on voice and audio signals includes at least a first sampling frequency conversion circuit, a second sampling frequency conversion circuit, a third sampling frequency conversion circuit, a first digital processing circuit and a second digital processing circuit. The first sampling frequency conversion circuit converts digital voice signals into signals sampling processed at a frequency, n×fs, as a multiple of a first predetermined sampling frequency fs with n being a first integral number larger than unity, and outputs resultant signals, in which the digital voice signals are previously sampling processed at the first predetermined sampling frequency fs.

The second sampling frequency conversion circuit converts digital audio signals into signals sampling processed at a frequency, N×Fs, as a multiple of a second predetermined sampling frequency Fs with N being a second integral number larger than unity, and outputs resultant signals, in which digital audio signals are previously sampling processed at the second predetermined sampling frequency Fs.

The third sampling frequency conversion circuit converts the signals output from the first sampling frequency conversion circuit into signals sampling processed at the frequency, N×Fs, and converts the signals output from the second sampling frequency conversion circuit into signals sampling processed at the frequency, n×fs, and outputs resultant signals.

The first digital processing circuit performs a predetermined digital processing operation on the digital voice signals converted into the signals sampling processed at the frequency, n×fs, by the first sampling frequency conversion circuit and on the digital audio signals converted into the signals sampling processed at the frequency, n×fs, by the third sampling frequency conversion circuit.

The second digital processing circuit performs another predetermined digital processing operation on the digital audio signals converted into the signals sampling processed at the frequency, N×Fs, by the second sampling frequency conversion circuit, and on the digital voice signals converted into the signals sampling processed at the frequency, N×Fs, by the third sampling frequency conversion circuit.

The first and second digital processing circuits included in the audio apparatus can perform respective predetermined mixing processes.

In addition, the audio apparatus can further include a first D/A conversion circuit incorporating a ΔΣ modulator for performing a predetermined D/A conversion on signals output from the first digital processing circuit and for outputting resultant signals, and a second D/A conversion circuit incorporating another ΔΣ modulator for performing another predetermined D/A conversion on signals output from the second digital processing circuit and for outputting resultant signals.

Further, the audio apparatus can include a first class D amplifier unit consisting of a class D amplifier incorporating a ΔΣ modulator, which is adapted to amplify signals output from the first digital processing circuit and output resultant signals, and a second class D amplifier unit consisting of a class D amplifier incorporating another ΔΣ modulator, which is adapted to amplify signals output from the second digital processing circuit and for outputting resultant signals.

Having described the present disclosure in general, the following more specific examples are provided further to illustrate preferred embodiments of the invention.

FIG. 1 shows a diagrammatic block diagram illustrating an audio apparatus according to a first embodiment disclosed herein. The audio apparatus is herein illustrated as a voice (audio) device included in a cellular (mobile) phone. In addition, the portions for transmitting and receiving voices, and for regenerating a voice and music are explained in the following description.

Referring to FIG. 1, the audio apparatus 1 includes at least a sampling frequency conversion circuit 2 consisting of first through third sampling frequency conversion circuits S0 through S2, a fourth sampling frequency conversion circuit S3, first through third D/A conversion circuits C0 through C2, first and second digital processing circuits D0 and D1, an audio (voice) speaker SP1 as voice outputting means, and an audio outputting means consisting an LCH (left channel) audio speaker SPL and an RCH (right channel)audio speaker SPR.

In addition, there constitute, respectively, are the first sampling frequency conversion circuit S0, the second sampling frequency conversion circuit S1, the third sampling frequency conversion circuit S3, the first digital processing circuits D0, and the second digital processing circuit D1 constitute a first sampling frequency conversion circuit unit, a second sampling frequency conversion circuit unit, a third sampling frequency conversion circuit unit, a first digital processing circuit unit and a second digital processing circuit unit, respectively.

Moreover, the first through fourth sampling frequency conversion circuits, S0 through S3, the first and second digital processing circuits, D0 and D1, first through fifth class D amplifiers, AMP 0 through AMP 4, the first and second digital processing circuits D0 and D1, and the first through third D/A conversion circuits C0 through C2, may be integrally mounted as an IC device.

As the sampling frequency fs for the digital received-voice signals SDV, a frequency of 8 kHz or 16 kHz may generally be used. By contrast, for sampling the digital audio signals SDM, sampling frequency Fs of 32 kHz, 44.1 kHz, or 48 kHz may be used.

In addition, in the present example the sampling frequencies, fs and Fs, are sometimes referred as second and first sampling frequencies, respectively.

It is noted that the way of performing operation processing is different for digital signals compared with analog. Namely, analog signals are continuous and can be subjected directly to operation processing such as signal addition or subtraction, but do not fit in sampling process.

By contrast, digital signals in this example are signals which result from sampling and are discrete with respect to time. As a result, addition or subtraction operation is typically not feasible between the signals which are sampled at sampling frequencies different each other.

In order to obviate such difficulty as mentioned above and facilitate processing operation of the signals in the present invention, in general, a sampling frequency conversion circuit is provided to convert digital audio signals SDM into signals which are. sampled at a sampling frequency, fs, (or more precisely, a multiple of fs) used for digital received-voice signals SDV.

In addition, the sampling frequency conversion circuit is provided to convert digital received-voice signals SDV into signals sampled at a sampling frequency, Fs, (or more precisely, a multiple of Fs) used for digital audio signals SDM.

As a result, by converting the sampling frequencies of the digital signals to be multiple of each other, the operations such as addition or subtraction of digital received-voice signals SDV to digital audio signals SDM and vice versa become feasible.

More specifically, from the sampling frequencies, fs and Fs, described in the previous example and the possible combinations thereof, several ways of processing may be implemented for the sampling frequency conversion. Then, certain combinations of digital received-voice signals SDV and digital music signal SDM may suitably be selected each time from those possible combinations depending on the conditions of sampling frequencies adopted for current use, such as two ways of sampling frequency conversion processing, one 8 kHz→44.1 kHz and the other 44.1 kHz→8 kHz, for example.

It is worth noting that the circuit technologies of sampling frequency conversion processing are well known as described, for example, by Lawrence R. Rabiner, "Interpretation and Decimation of Digital Signal—A Tutorial Review," Proceeding of IEEE, Vol. 69, No. 3, March 1981.

Referring again to FIG. 1, digital received-voice signals SDV, after received and demodulated through sampling at a sampling frequency fs, are subjected by a first sampling frequency conversion circuit S0 to oversampling process with a frequency, n×fs, as a multiple of fs (with n being an integral number larger than unity).

Subsequently, resultant signals are sent to both a first digital processing circuit D0 and a third sampling frequency conversion circuit S2.

Ina similar manner, digital audio signals SDM, after they are regenerated through sampling at another sampling frequency Fs, are subjected by a second sampling frequency conversion circuit S1 to sampling process with a frequency, N×Fs, as a multiple of Fs (with N being an integral number larger than one).

Subsequently, resultant signals are sent to both a second digital processing circuit D1 and the third sampling frequency conversion circuit S2.

The third sampling frequency conversion circuit S2 is adapted to convert the digital received-voice signals, which were previously subjected to the oversampling process with the frequency n×fs by the first sampling frequency conversion circuit S0, to the signals sample-processed at the same frequency N×Fs as for the digital audio signals SDM. Subsequently, resultant signals are output to the second digital processing circuit D1.

Further, the third sampling frequency conversion circuit S2 is also adapted to convert the digital audio signals, which were previously subjected to the sampling process with the frequency N×fs by the second sampling frequency conversion circuit S1, to the signals sample-processed at the frequency N×Fs as for the digital received-voice signals SDV. Subsequently, resultant signals are output to the first digital processing circuit D0.

The first digital processing circuit D0 then performs predetermined mixing-process on the signals output from the first sampling frequency conversion circuit S0 and third sampling frequency conversion circuit S2, and the signals resulting from the mixing-process are subsequently output to a fourth sampling frequency conversion circuit S3.

The fourth sampling frequency conversion circuit S3 performs sampling frequency conversion process on the signals, which were sampling-processed with the frequency n×fs and output from first digital processing circuit D0, so as to achieve the frequency suitable for performing appropriate converting-process by a first D/A conversion circuit C0 incorporating the ΔΣ modulator.

The signals resulting from the sampling frequency conversion process are thereafter output to the first D/A conversion circuit C0.

The first D/A conversion circuit C0 is adapted to convert the signals output from the fourth sampling frequency conversion circuit S3 into analog signals, with which an audio (voice) speaker SP1 can operate.

Similarly, the second digital processing circuit D1 performs predetermined mixing-process on the signals output from the second sampling frequency conversion circuit S1 and third sampling frequency conversion circuit S2, and the signals resulting from the mixing-process are subsequently output to second and third D/A conversion circuits, C1 and C2.

The second D/A conversion circuit C1 is adapted to convert the signals output from the second digital processing circuit D1 into analog signals, with which an LCH audio speaker SPL can operate. The third D/A conversion circuit C2 is adapted to convert the signals output from the second digital processing circuit D1 into analog signals, with which a RCH audio speaker SPR can operate.

It may be added herein that the above noted D/A conversion circuits, C0 through C2, each incorporating ΔΣ modulators are each so-called one-bit DACs (digital-to-analog converters) capable of achieving high resolution and dynamic range in signal conversion by first performing the oversampling process on digital data signal inputs that takes to the frequencies higher than the bandwidth, quantizing the signals in low bits typically ranging approximately from one to four and shifting quantizing noises outside the bandwidth through filtering, and extracting signals within suitable bandwidth through filtering with an analog filter having gradual filtering characteristics.

Therefore, after sampling at the sampling frequency Fs with the above noted configuration of the frequency conversion and process circuits, the digital audio signals SDM are converted into the signals which are sampled at frequency N×Fs by the second sampling frequency conversion circuit S1.

The second sampling frequency conversion circuit S1 is then adapted to obtain the same frequency spectrum as original signals utilizing the digital filtering method by removing image (or spurious) components through filtering following the zero interpolation.

By contrast, having a narrower bandwidth than the digital audio signals SDM, digital received-voice signals SDV are sampled at the fs sampling frequency and converted further by first sampling frequency conversion circuit S0 into the signals sampled at the n×fs sampling frequency.

As mentioned above, the digital audio signals SDM are converted into the signals sampled at N·Fs sampling frequency. The signals SDM are then converted into the signals sampled at the n×fs sampling frequency by the third sampling frequency conversion circuit S2.

In the case of Fs=44.1 kHz, fs=8 kHz, and n=N=5, for example, the signals sampled at 5×44.1 kHz sampling frequency are converted into the signals sampled at 5×8 kHz sampling frequency, which is (80/441) times the 5×44.1 kHz frequency.

The process of multiplying the sampling frequency by factor (80/441) is performed in a similar manner to the second sampling frequency conversion circuit S1, in which the oversampling process by 80 times is followed by a 1/441 decimation process. The decimation process is also performed in a similar manner to the oversampling process using digital filter method, by first removing the components having a frequency higher than Nyquist frequency by the filter, and by thinning 443 sampling data at the interval of 444 sampling period.

The first digital processing circuit D0 performs the digital operation process, mixing-process herein, on the digital audio signals SDM converted into the signals sampled at the 5×fs sampling frequency by the third sampling frequency conversion circuit S2 and the digital received-voice signals SDV sampled at the 5×fs sampling frequency by the first sampling frequency conversion circuit S0.

The signals resulting from the mixing-process by the first digital processing circuit D0 are subjected to the sampling frequency conversion process by the fourth sampling frequency conversion circuit S3 so as to achieve the frequency suitable for performing appropriate converting-process by the first D/A conversion circuit C0 incorporating the ΔΣ modulator, and converted into analog signals by the first D/A conversion circuit C0, with which an audio (voice) speaker SP1 is operated.

As mentioned earlier, the D/A conversion circuit incorporating the ΔΣ modulator is the so-called one-bit DACs, which is capable of achieving high resolution signal conversion by first oversampling the digital data signal inputs that takes to the frequencies higher than the bandwidth, quantizing the signals in low bits typically ranging approximately from one to four and displacing quantizing noises outside the bandwidth through filtering, and extracting signals within suitable bandwidth through filtering with an analog filter having gradual filtering characteristics.

In a similar manner, the second digital processing circuit D1 performs the digital operation process, or mixing-process, on the digital received-voice signals SDV converted into the signals sampled at the 5·fs sampling frequency by the third sampling frequency conversion circuit S2 and the digital audio signals SDM sampled at the 5·Fs sampling frequency by the second sampling frequency conversion circuit S1.

The signals resulting from the mixing-process by the second digital processing circuit D1 are converted into analog signals by the second and third D/A conversion circuits, C1 and C2, each incorporating the ΔΣ modulator, with which the LCH audio speaker SPL and the RCH audio speaker SPR can be operated, respectively.

Therefore, in performing digital operation process on the signals sampling-processed at different sampling frequencies, it becomes feasible that the frequency bandwidth is secured and the degradation in audio characteristics with respect to original signals is obviated, by first converting into the signals sampling-processed at different sampling frequencies, each being n and N times the basic sampling frequency and subsequently performing digital process on the signals.

The above-noted process obviates the degradation in audio characteristics, in that the process on the digital received-voice signals SDV is achieved at the sampling frequency not fs but n·fs during the sampling frequency conversion.

As the sampling frequency fs for the digital received-voice signals SDV, 8 kHz is generally used. By contrast, 32 kHz, 44.1 kHz, or 48 kHz is used for sampling the digital audio signals SDM. The process is now described herein below on the case of 44.1 kHz.

Figure 2:
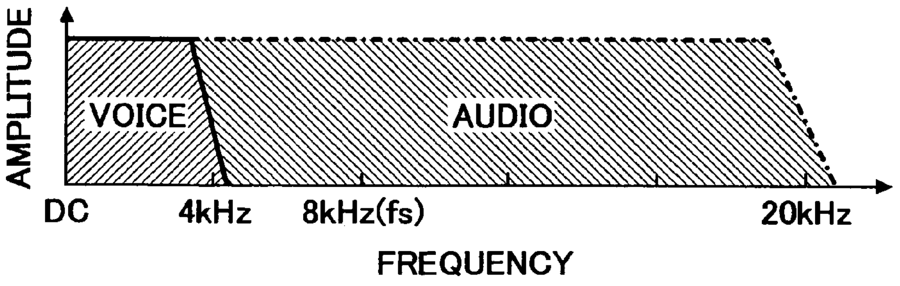
FIG. 2 illustrates a spectrum of signals resulted from a mixing-process through analog operation on analog received-voice signals D/A converted from digital received-voice signals, and analog audio signals D/A converted from digital audio signals.

FIG. 2 illustrates a spectrum of the signals resulted from mixing-process through analog operation on analog received-voice signals, which are D/A converted from digital received-voice signals, and analog audio signals, which are D/A converted from digital audio signals.

Referring to FIG. 2, it is shown that the resultant spectrum is a superposition of two spectra, that is, voice signal and audio signal spectra, having the bandwidth ranging from DC to 4 kHz, and from DC to 20 kHz, respectively.

Figure 3A:
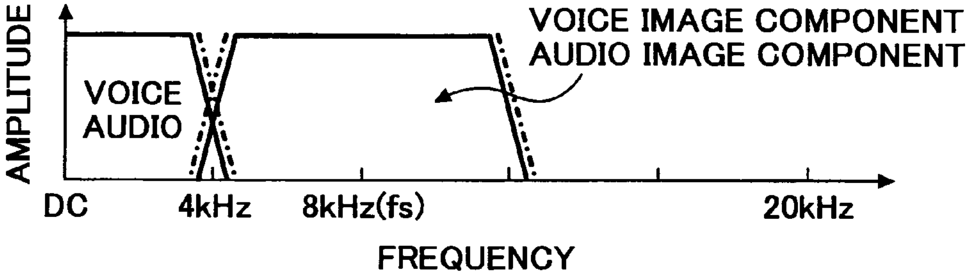
FIG. 3A illustrates a spectrum of signals resulted from a mixing-process through digital operation, which is carried out after converting the sampling frequency Fs for digital audio signals SDM into the frequency fs for digital received-voice signals SDV.

By contrast, the spectrum of FIG. 3A is illustrated for the signals resulted from mixing-process through digital operation, which is carried out after converting the sampling frequency Fs for digital audio signals SDM into the frequency fs for digital received-voice signals SDV (i.e., n=N=1).

Figure 3B:
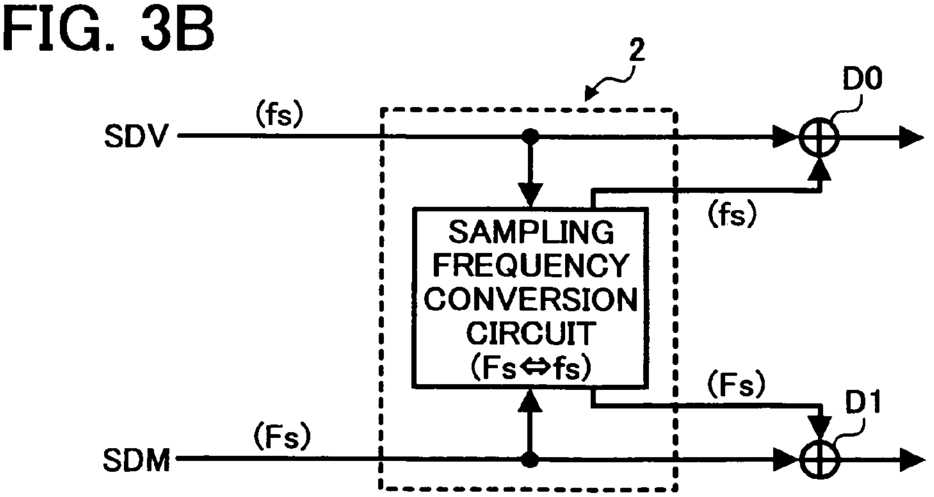
FIG. 3B illustrates a sampling frequency conversion circuit adapted to function as a band limiting filter so as to obtain the spectrum of FIG. 3A.

It is noted that the frequency spectrum of FIG. 3A is obtained by such configuration of sampling frequency conversion circuit 2 as illustrated in FIG. 3B.

Incidentally, the portion dash-lined in FIG. 3A corresponds to the region of audio bandwidth formed after suppressed by a band limiting filter included in the sampling frequency conversion circuit 2 of FIG. 3B, which is approximately equal to the voice bandwidth, as also shown in FIG. 3A.

Regarding to the configuration of FIG. 3B, when the sampling frequency Fs for digital audio signals SDM is converted into the frequency fs for digital received-voice signals SDV having a narrower band width, a band-limiting operation is performed by the band limiting filter included in the sampling frequency conversion circuit 2 on the sampling frequency fs to limit within the Nyquist frequency so as not to cause any turnover component after the conversion.

As shown in FIG. 3A, therefore, audio spectral range of the signal components following the mixing process become narrower compared with that of FIG. 2, to thereby be limited to the range of only from DC to 4 kHz, which is approximately the same as received-voice signals.

In other words, it is shown in FIGS. 2 and 3, by the conversion of the sampling frequency Fs for digital audio signals SDM into the frequency fs for digital received-voice signals SDV having a narrower band width, the components ranging from 4 kHz to 20 kHz are suppressed, and this results in the deterioration in audio characteristics and phonetic effects compared with the analog signal mixing.

By contrast, a further mixing-process through digital operation is performed by setting n=N=5, that is, after converting the sampling frequency Fs for digital audio signals SDM into five times the frequency fs for digital received-voice signals SDV. The spectrum of the signals resulting from the operation is shown in FIG. 4.

Figure 4:
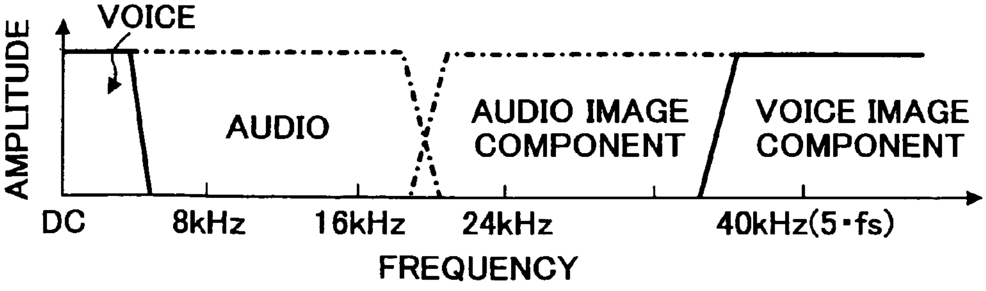
FIG. 4 illustrates a spectrum of signals resulted from a mixing-process through digital operation by setting n=N=5, that is, after converting the sampling frequency Fs for digital audio signals into five times the frequency fs for digital received-voice signals SDV.

Referring to FIG. 4, the components of audio signals ranges from DC to 20 kHz, and none of the above noted suppression of audio component is observed. Namely, the spectrum now becomes the same as that of analog signals, and the degradation in signal characteristics due to the digital process can be obviated.

Figure 5:
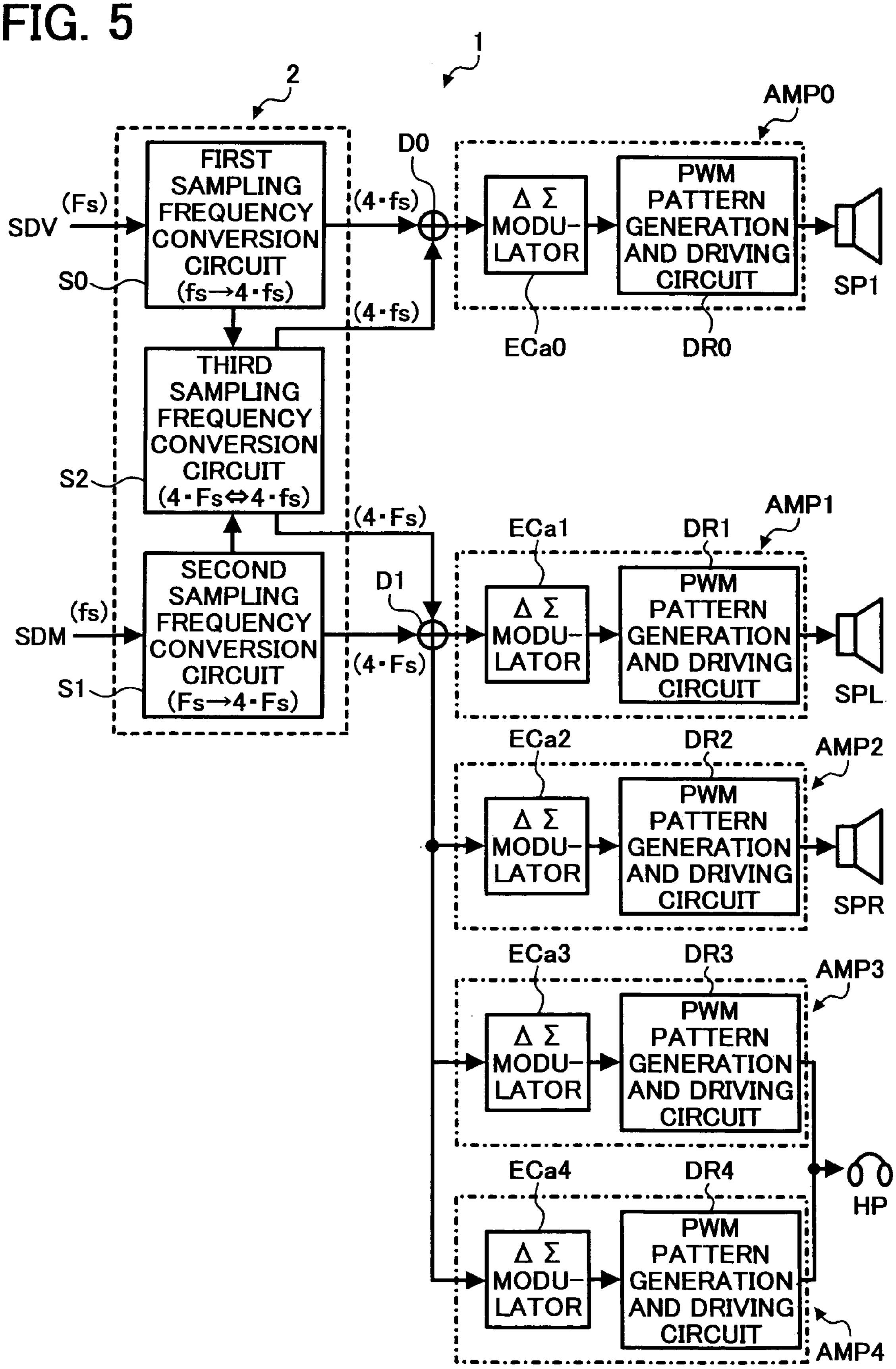
FIG. 5 shows a diagrammatic block diagram illustrating an audio apparatus according to a second embodiment disclosed herein.
Figure 6:
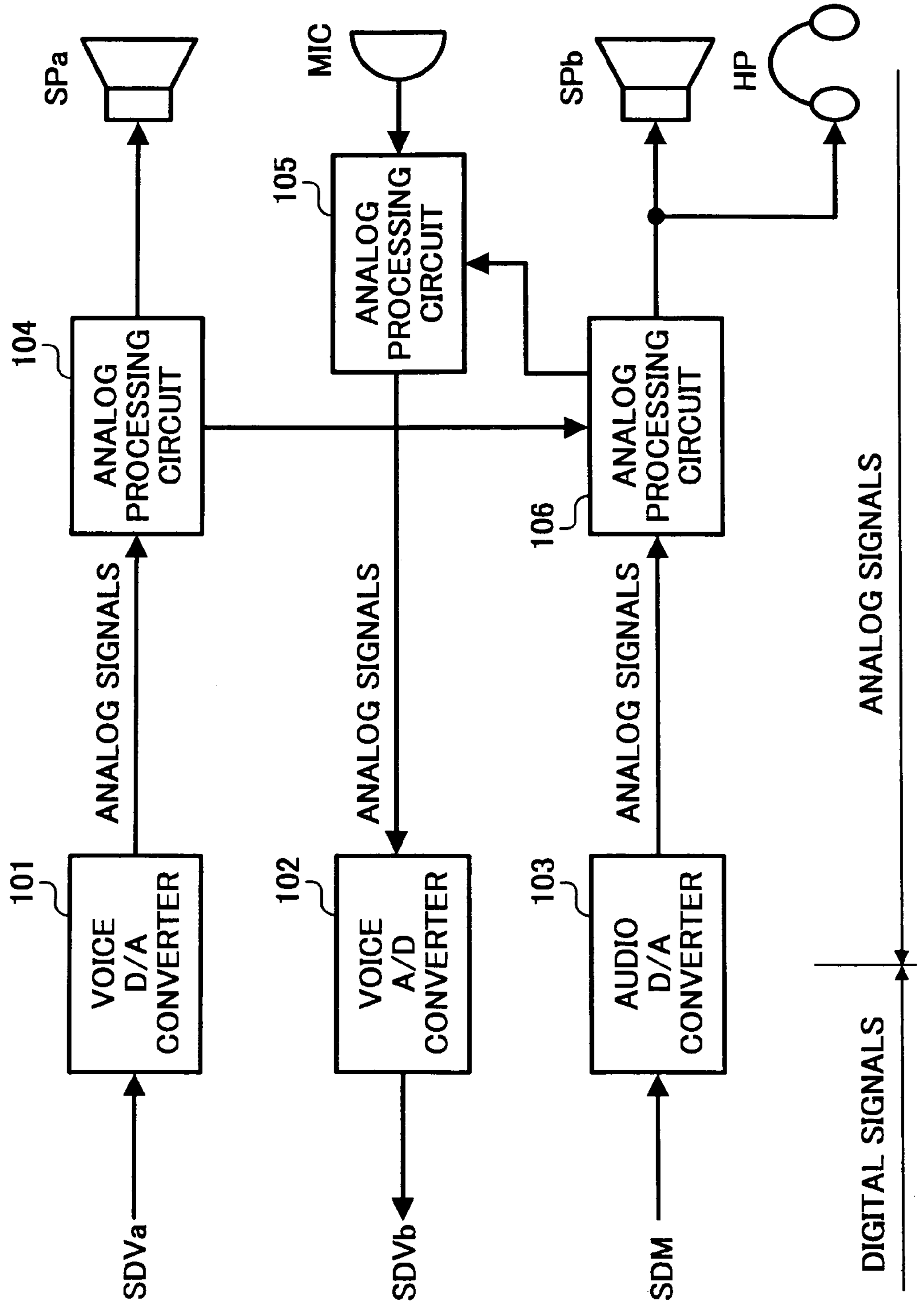
FIG. 6 PRIOR ART
FIG. 6 shows a diagrammatic block diagram illustrating a known audio apparatus included in a mobile phone adapted to perform voice signal processing.
Figure 7:
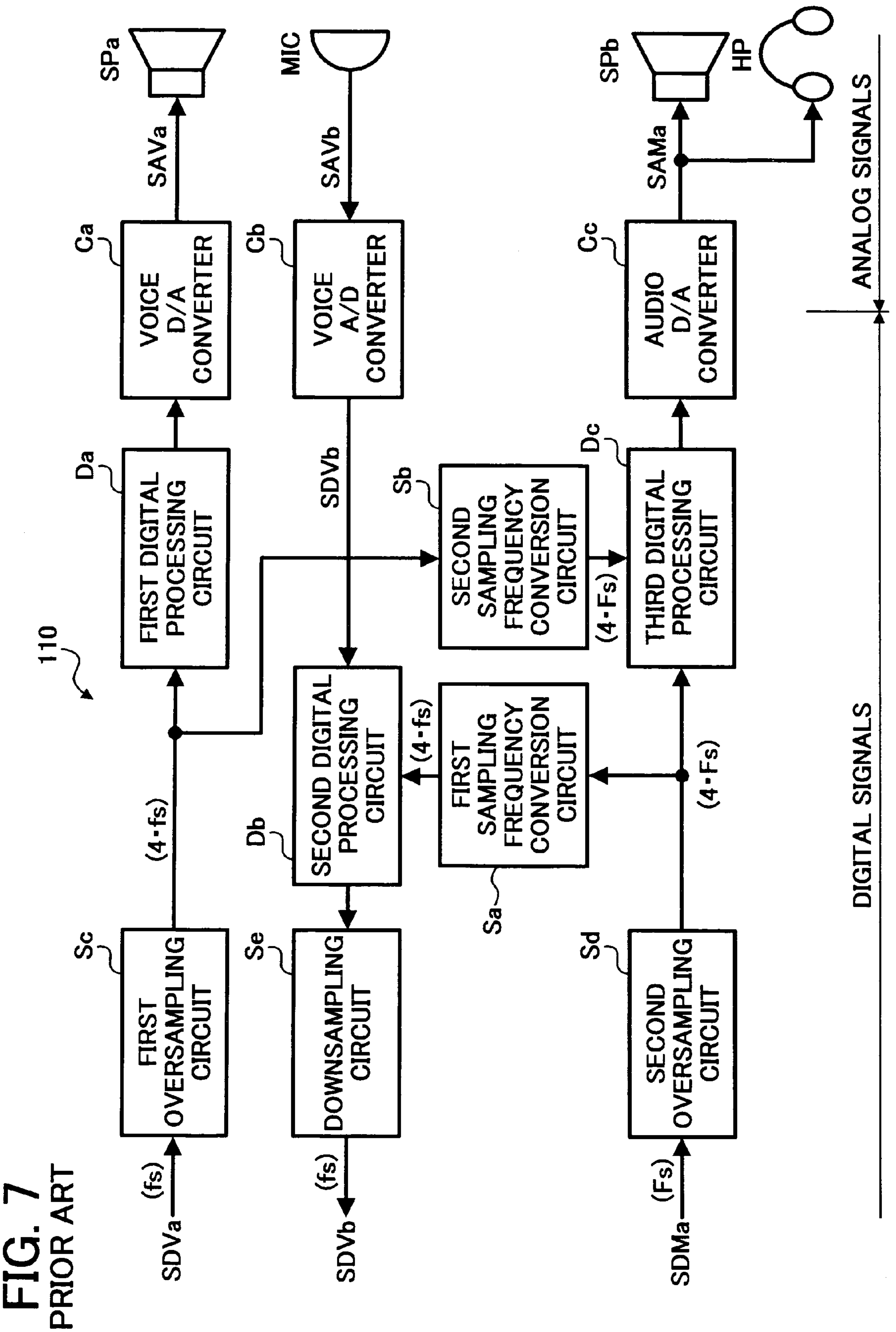
FIG. 7 PRIOR ART
FIG. 7 shows a diagrammatic block diagram illustrating another known audio apparatus, in which input signals such as digital voice signals and digital audio signals can be subjected to digital processing directly in the digital domain without converting into analog signals.
Figure 8:
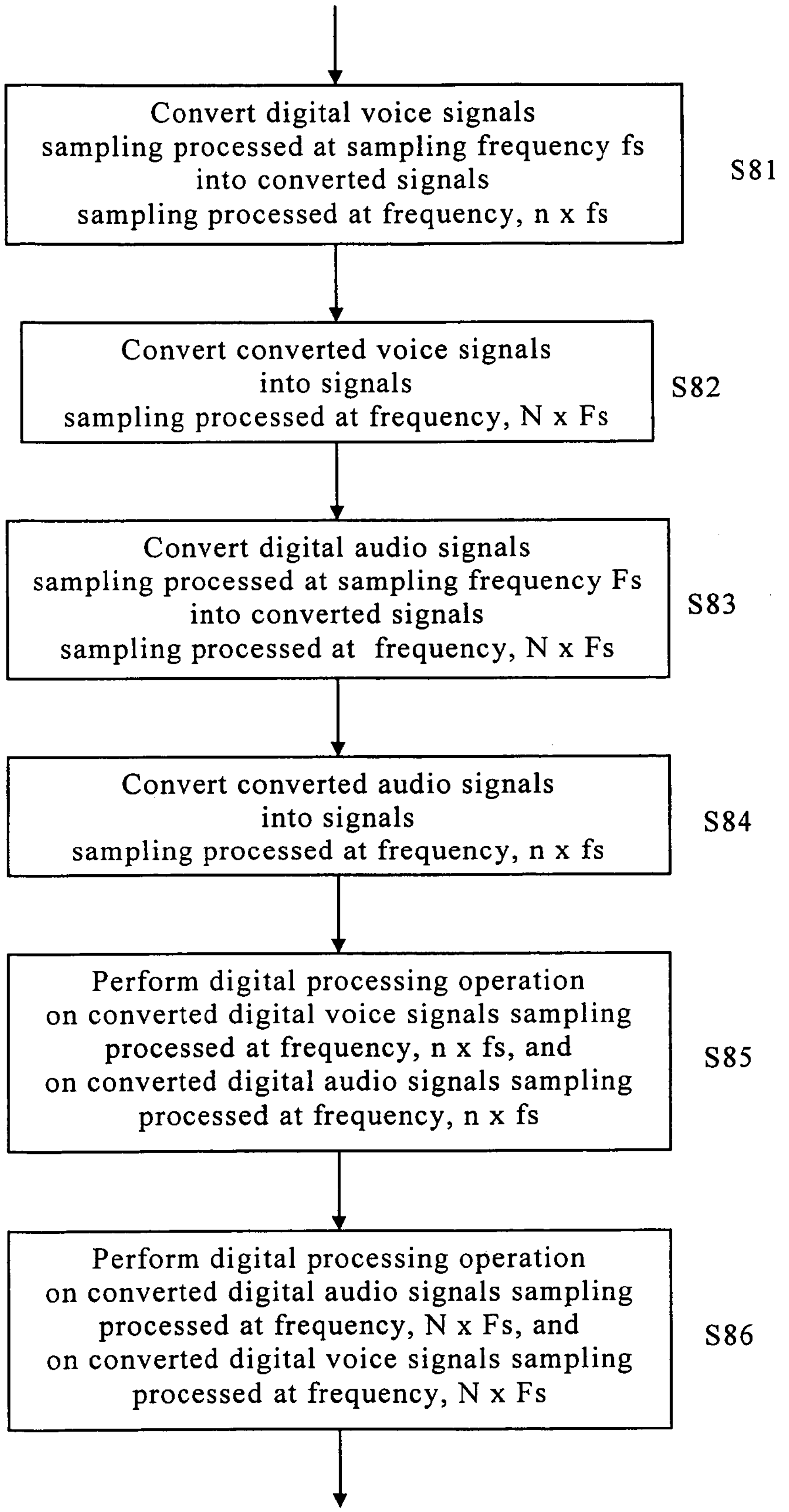
FIG. 8 shows a flow chart for a method for performing signal processing on voice and audio signals.

FIG. 5 shows a diagrammatic block diagram illustrating an audio apparatus according to a second embodiment disclosed herein. The components of FIG. 5 similar to those of FIG. 1 are shown with identical numerical representation and detailed description thereof is herein abbreviated unless particular necessary for clarifying characteristic features of the embodiment.

In addition, the embodiment is illustrated for the case of n=N=4, and the circuit for operating a stereo headphone HP is included in addition to the units noted earlier such as audio (voice) speaker SP1, LCH audio speaker SPL, and RCH audio speaker SPR.

The configuration of FIG. 5 is similar to FIG. 1, with the exception that the fourth sampling frequency conversion circuit S3 is removed, and that class D amplifiers, AMP 0 through AMP 4, are used in place of the D/A conversion circuits, C0 through C2.

A first class D amplifier AMP 0 operates as a first class D amplifier unit, and class D amplifiers, AMP 1 through 4, operate as a second class D amplifier unit, respectively.

In addition, the first through third sampling frequency conversion circuits, S0 through S2, the first and second digital processing circuits, D0 and D1, and the first through fifth class D amplifiers, AMP 0 through AMP 4, may be integrally mounted as an IC device.

The class D amplifier using ΔΣ modulator, in general, consists of a sampling frequency conversion circuit, a ΔΣ modulator, and a PWM (pulse width modulation) generation and driver circuit.

In order to achieve high signal resolution, the frequency for ΔΣ modulation is set to an integral multiple of the Nyquist frequency of the original signals. The frequency conversion process for this setting is carried out by the sampling frequency conversion circuit.

In the first through fifth class D amplifiers, AMP 0 through AMP 4, the ΔΣ modulators are adapted to regenerate high resolution signals by quantizing input signals in one bit (or a few bits) and outputting, and also operating high pass filtering process to remove emerging quantizing noises.

Subsequently, final output signals are obtained by generating driver on-off signals through PWM patterning of the signals output from the ΔΣ modulator at a frequency higher than the modulation frequency, and switching the driver circuit.

Therefore, by utilizing the class D amplifiers including ΔΣ modulators in place of the aforementioned D/A converter circuits, every process throughout the circuit can be carried out solely as digital process. As a result, the degradation in signal quality can be obviated, which may otherwise be caused by intervening analog signals.

When plural class D amplifiers are utilized, a plurality of sampling frequency conversion process become necessary, as described earlier. In this case, the increase in circuit size primarily resulting from driving a plurality of external loads related to the plural processing can be alleviated in the circuit of FIG. 5, by sharing some portions of the sampling frequency conversion process which is used for performing digital operation with sampling frequency conversion process which is necessary for the sampling frequency conversion process by the class D amplifiers, and by distributing to respective ΔΣ modulators.

It is apparent from the above description including the examples that the present audio apparatus has several advantages over similar methods previously known.

For example, in processing voice and audio signals sampled at sampling frequencies different with each other by the audio signal processing apparatus according to the embodiments of the invention, input signals are converted by the sampling frequency conversion circuit 2 into the signals sampling-processed respectively at different sampling frequencies as high as possible such as n and N times the basic sampling frequency, for example, and digital operation process is then performed on the signals.

As a result, it becomes feasible that the frequency bandwidth is secured with respect to original signals and the degradation in audio signal characteristics can be obviated.

In addition, the degradation is further prevented with the present audio apparatus by performing digital signal processing thoroughly after eliminating analog signals by utilizing class D amplifiers for driving external load such as a speaker and similar other device.

Still in addition, the increase in circuit size, which can result from the adoption of class D amplifiers, can be obviated by sharing some portions of the sampling frequency conversion process which is used for performing digital operation with sampling frequency conversion process which is necessary for the sampling frequency conversion process by the class D amplifiers, and by distributing to respective ΔΣ modulators.

Additional modifications and variations of the present invention are possible in light of the above teachings. It is therefore to be understood that within the scope of the appended claims, the invention may be practiced other than as specifically described herein. For example, elements and/or features of different illustrative embodiments may be combined with each other and/or substituted for each other within the scope of this disclosure and appended claims.

This disclosure claims priority and contains subject matter related to Japanese Patent Application No. 2004-259735, filed on Sep. 7, 2004, the entire contents of which are incorporated herein by reference.

What is claimed is:

1. An audio apparatus for performing a predetermined signal processing on voice and audio signals, comprising:

a first sampling frequency conversion circuit for converting digital voice signals into first converted signals sampling processed at a frequency, n×fs, as a multiple of a first predetermined sampling frequency fs with n being a first integral number larger than unity, and for outputting first resultant signals, said digital voice signals previously being sampling processed at the first predetermined sampling frequency fs;

a second sampling frequency conversion circuit for converting digital audio signals into second converted signals sampling processed at a frequency, N×Fs, as a multiple of a second predetermined sampling frequency Fs with N being a second integral number larger than unity, and for outputting second resultant signals, said digital audio signals previously being sampling processed at the second predetermined sampling frequency Fs;

a third sampling frequency conversion circuit for converting said first resultant signals output from said first sampling frequency conversion circuit into third converted signals sampling processed at the frequency, N×Fs, and said second resultant signals output from said second sampling frequency conversion circuit into fourth converted signals sampling processed at the frequency, n×fs, and for outputting third resultant signals;

a first digital processing circuit for performing a predetermined digital processing operation on said digital voice signals converted into said first converted signals sampling processed at the frequency, n×fs, by said first sampling frequency conversion circuit and on said digital audio signals converted into said fourth converted signals sampling processed at the frequency, n×fs, by said third sampling frequency conversion circuit; and a second digital processing circuit for performing another predetermined digital processing operation on said digital audio signals converted into said second converted signals sampling processed at the frequency, N×Fs, by said second sampling frequency conversion circuit and on said digital voice signals converted into said third converted signals sampling processed at the frequency, N×Fs, by said third sampling frequency conversion circuit.

2. The audio apparatus according to claim 1, wherein said first and second digital processing circuits perform respective predetermined mixing processes.

3. The audio apparatus according to claim 1, further comprising:

a first D/A conversion circuit including a ΔΣ modulator for performing a predetermined D/A conversion on first processed signals output from said first digital processing circuit and for outputting fourth resultant signals; and a second D/A conversion circuit including another ΔΣ modulator for performing another predetermined D/A conversion on second processed signals output from said second digital processing circuit and for outputting fifth resultant signals.

4. The audio apparatus according to claim 1, further comprising:

a first class D amplifier unit consisting of a first class D amplifier including a ΔΣ modulator for amplifying said first resultant signals output from said first digital processing circuit and for outputting fourth resultant signals; and a second class D amplifier unit consisting of a second class D amplifier including another ΔΣ modulator for amplifying said second resultant signals output from said second digital processing circuit and for outputting fifth resultant signals.

5. The audio apparatus according to claim 2, further comprising:

a first D/A conversion circuit including a ΔΣ modulator for performing a predetermined D/A conversion on first processed signals output from said first digital processing circuit and for outputting fourth resultant signals; and a second D/A conversion circuit including another ΔΣ modulator for performing another predetermined D/A conversion on second processed signals output from said second digital processing circuit and for outputting fifth resultant signals.

6. The audio apparatus according to claim 2, further comprising:

a first class D amplifier unit consisting of a first class D amplifier including a ΔΣ modulator for amplifying said first resultant signals output from said first digital processing circuit and for outputting fourth resultant signals; and a second class D amplifier unit consisting of a second class D amplifier including another ΔΣ modulator for amplifying said second resultant signals output from said second digital processing circuit and for outputting fifth resultant signals.

7. An audio apparatus for performing a predetermined signal processing on voice and audio signals, comprising:

first converting means for converting digital voice signals into first converted signals sampling processed at a frequency, n×fs, as a multiple of a first predetermined sampling frequency fs with n being a first integral number larger than unity and, for outputting first resultant signals, said digital voice signals previously being sampling processed at the first predetermined sampling frequency fs;

second converting means for converting digital audio signals into second converted signals sampling processed at a frequency, N×Fs, as a multiple of a second predetermined sampling frequency Fs with N being a second integral number larger than unity, and for outputting second resultant signals, said digital audio signals previously being sampling processed at the second predetermined sampling frequency Fs;

third converting means for converting said first resultant signals output from said first converting means into third converted signals sampling processed at the frequency, N×Fs, and converting said second resultant signals output from said second converting means for into fourth converted signals sampling processed at the frequency, n×fs, and for outputting third resultant signals;

first digital processing means for performing a predetermined digital processing operation on said digital voice signals converted into said first converted signals sampling processed at the frequency, n×fs, by said first converting means and on said digital audio signals converted into said fourth converted signals sampling processed at the frequency, n×fs, by said third converting means; and second digital processing means for performing another predetermined digital processing operation on said digital audio signals converted into said second converted signals sampling processed at the frequency, N×Fs, by said second converting means for converting and on said digital voice signals converted into said third converted signals sampling processed at the frequency, N×Fs, by said third converting means.

8. The audio apparatus according to claim 7, wherein said first and second digital processing means perform respective predetermined mixing processes.

9. The audio apparatus according to claim 7, further comprising:

first D/A conversion means for performing a predetermined D/A conversion on first processed signals output from said first digital processing means and for outputting fourth resultant signals; and second D/A conversion means for performing another predetermined D/A conversion on second processed signals output from said second digital processing means and for outputting fifth resultant signals.

10. The audio apparatus according to claim 7, further comprising:

first class D amplifier means consisting of a first class D amplifier including a ΔΣ modulator for amplifying said first resultant signals output from said first digital processing means and for outputting fourth resultant signals; and second class D amplifier means consisting of a second class D amplifier including another ΔΣ modulator for amplifying said second resultant signals output from said second digital processing means and for outputting fifth resultant signals.

11. An audio apparatus for performing signal processing on voice and audio signals, said audio apparatus comprising:

a sampling frequency conversion circuit configured to (a) convert digital voice signals previously sampling processed at a first predetermined sampling frequency fs into first converted signals sampling processed at a frequency, n×fs, as a multiple of the first predetermined sampling frequency fs with n being a first integral number larger than unity, (b) convert digital audio signals previously sampling processed at a second predetermined sampling frequency Fs into second converted signals sampling processed at a frequency, N×Fs, as a multiple of the second predetermined sampling frequency Fs with N being a second integral number larger than unity, (c) convert the first converted signals into third converted signals sampling processed at the frequency, N×Fs, and (d) convert the second converted signals into signals sampling processed at the frequency, n×fs; and a digital processing circuit configured to (i) perform a first predetermined digital processing operation on the digital voice signals converted into the first converted signals sampling processed at the frequency, n×fs, and on the digital audio signals converted into the fourth converted signals sampling processed at the frequency, n×fs, and (ii) perform a second predetermined digital processing operation on the digital audio signals converted into the second converted signals sampling processed at the frequency, N×Fs, and on the digital voice signals converted into the third converted signals sampling processed at the frequency, N×Fs.

12. A method for performing signal processing on voice and audio signals, said method comprising:

converting digital voice signals previously sampling processed at a first predetermined sampling frequency fs into first converted signals sampling processed at a frequency, n×fs, as a multiple of the first predetermined sampling frequency fs with n being a first integral number larger than unity;

converting digital audio signals previously sampling processed at a second predetermined sampling frequency Fs into second converted signals sampling processed at a frequency, N×Fs, as a multiple of the second predetermined sampling frequency Fs with N being a second integral number larger than unity;

converting the first converted signals into third converted signals sampling processed at the frequency, N×Fs;

converting the second converted signals into signals sampling processed at the frequency, n×fs;

performing a first predetermined digital processing operation on the digital voice signals converted into the first converted signals sampling processed at the frequency, n×fs, and on the digital audio signals converted into the fourth converted signals sampling processed at the frequency, n×fs; and performing a second predetermined digital processing operation on the digital audio signals converted into the second converted signals sampling processed at the frequency, N×Fs, and on the digital voice signals converted into the third converted signals sampling processed at the frequency, N×Fs.

13. The method of claim 12, wherein said first and second predetermined digital processing operations include performing respective predetermined mixing processes.

* * * * *